(12) United States Patent
Bombara et al.

(10) Patent No.: US 10,897,114 B2
(45) Date of Patent: Jan. 19, 2021

(54) CONFIGURABLE LOW VOLTAGE POWER PANEL

(71) Applicant: Light Corp Inc., Grand Haven, MI (US)

(72) Inventors: Peter Bombara, Holland, MI (US); Josh Bordewyk, Grand Haven, MI (US); Cody Cole, Grant, MI (US); Mike Myers, Muskegon, MI (US); Greg Swears, Spring Lake, MI (US); Andrew Zeiler, Coopersville, MI (US); Brandon Nickolas, Muskegon, MI (US)

(73) Assignee: Light Corp Inc., Grand Haven, MI (US)

( * ) Notice: Subject to any disclaimer, the term of this patent is extended or adjusted under 35 U.S.C. 154(b) by 0 days.

(21) Appl. No.: 16/282,827

(22) Filed: Feb. 22, 2019

(65) Prior Publication Data

US 2019/0260171 A1   Aug. 22, 2019

Related U.S. Application Data

(60) Provisional application No. 62/634,054, filed on Feb. 22, 2018.

(51) Int. Cl.
| | |
|---|---|
| *H01R 13/62* | (2006.01) |
| *H01R 25/16* | (2006.01) |
| *A47F 10/00* | (2006.01) |
| *H01R 4/2483* | (2018.01) |
| *H01R 33/88* | (2006.01) |
| *H05K 5/02* | (2006.01) |

(Continued)

(52) U.S. Cl.
CPC ............. *H01R 33/88* (2013.01); *A47F 10/00* (2013.01); *H01R 13/6205* (2013.01); *H01R 25/147* (2013.01); *H01R 25/161* (2013.01); *H02G 3/388* (2013.01); *H05K 5/0247* (2013.01); *H01R 4/2483* (2013.01)

(58) Field of Classification Search
CPC .... H01R 13/6205; H01R 11/30; H01R 25/14; H01R 25/142; H01R 25/145; H01R 25/147; H01R 25/16; H01R 25/161; H01R 25/162; H01R 25/164; H01R 25/165; H01R 4/2483; H01R 33/88; H02G 3/388; H05K 5/0247; A47F 10/00
See application file for complete search history.

(56) References Cited

U.S. PATENT DOCUMENTS

| | | | |
|---|---|---|---|
| 4,056,297 A | 11/1977 | Gartung | |
| 4,143,931 A * | 3/1979 | Skare | H01R 12/67 |
| | | | 174/117 A |

(Continued)

*Primary Examiner* — Edwin A. Leon
*Assistant Examiner* — Milagros Jeancharles
(74) *Attorney, Agent, or Firm* — Honigman LLP

(57) ABSTRACT

A power distribution system includes a panel assembly that has an outer surface and two conductive structures spaced from each other and spanning beneath the outer surface. An application module is configured to engage one of a plurality of locations disposed over the outer surface of the panel assembly. The application module includes a first contact configured to engage the first conductive structure and a second contact configured to engage the second conductive structure. The second contact is electrically insulated from the first contact and the first conductive structure for the panel assembly to deliver low voltage power to the engaged application module.

21 Claims, 14 Drawing Sheets

(51) Int. Cl.
*H02G 3/38* (2006.01)
*H01R 25/14* (2006.01)

(56) References Cited

U.S. PATENT DOCUMENTS

| | | | |
|---|---|---|---|
| 4,278,834 A | 7/1981 | Boundy | |
| 4,451,113 A * | 5/1984 | Zuniga | H01R 13/6205 439/32 |
| 4,578,731 A * | 3/1986 | Andriessen | B60M 7/006 174/70 R |
| 4,781,609 A | 11/1988 | Wilson et al. | |
| 4,920,467 A * | 4/1990 | Honsberger | H01R 4/2406 362/658 |
| 5,010,463 A * | 4/1991 | Ross | F21V 19/0025 362/234 |
| 5,013,252 A | 5/1991 | Nienhuis et al. | |
| 5,112,240 A | 5/1992 | Nienhuis et al. | |
| 5,131,860 A | 7/1992 | Bogiel | |
| 5,336,097 A | 8/1994 | Williamson, Jr. et al. | |
| 5,562,469 A | 10/1996 | Nienhuis et al. | |
| 5,606,919 A | 3/1997 | Fox et al. | |
| 5,695,261 A | 12/1997 | Slesinger et al. | |
| 5,768,840 A | 6/1998 | Feldpausch et al. | |
| 6,132,859 A * | 10/2000 | Jolly | H02G 5/005 428/319.3 |
| 6,527,406 B1 | 3/2003 | Slesinger et al. | |
| 6,575,777 B2 | 6/2003 | Henriott et al. | |
| 6,688,901 B2 | 2/2004 | Boyd et al. | |
| 6,830,468 B2 | 12/2004 | Schaerer et al. | |
| 6,913,477 B2 * | 7/2005 | Dayan | H01R 13/22 439/188 |
| 7,465,178 B2 | 12/2008 | Byrne | |
| 7,665,883 B2 * | 2/2010 | Matheson | F21V 23/06 362/652 |
| 7,726,973 B1 * | 6/2010 | Perry | H01R 13/6205 439/39 |
| 8,146,229 B2 | 4/2012 | Henriott et al. | |
| 8,235,826 B2 * | 8/2012 | Randall | A63F 3/00643 273/237 |
| 8,356,909 B2 * | 1/2013 | Verjans | E04F 15/18 362/145 |
| 8,390,184 B2 * | 3/2013 | Pet | F21V 21/35 313/317 |
| 8,444,425 B2 | 5/2013 | Byrne | |
| 8,496,492 B2 | 7/2013 | Byrne | |
| 8,525,402 B2 * | 9/2013 | Aeling | H05K 1/11 313/498 |
| 10,073,752 B2 * | 9/2018 | McWethy | G06F 11/3051 |
| 10,096,938 B2 * | 10/2018 | McClelland | H01R 13/629 |
| 2002/0005019 A1 | 1/2002 | Trilli et al. | |
| 2003/0015332 A1 * | 1/2003 | Hassam | H02G 3/00 174/482 |
| 2004/0026998 A1 | 2/2004 | Henriott et al. | |
| 2004/0095773 A1 | 5/2004 | Gaskins et al. | |
| 2004/0228122 A1 | 11/2004 | Slesinger et al. | |
| 2009/0042428 A1 | 2/2009 | Henriott et al. | |
| 2010/0201202 A1 | 8/2010 | Kirby et al. | |
| 2010/0290215 A1 | 11/2010 | Metcalf et al. | |
| 2013/0207478 A1 | 8/2013 | Metcalf et al. | |
| 2014/0106610 A1 | 4/2014 | Byrne et al. | |

* cited by examiner

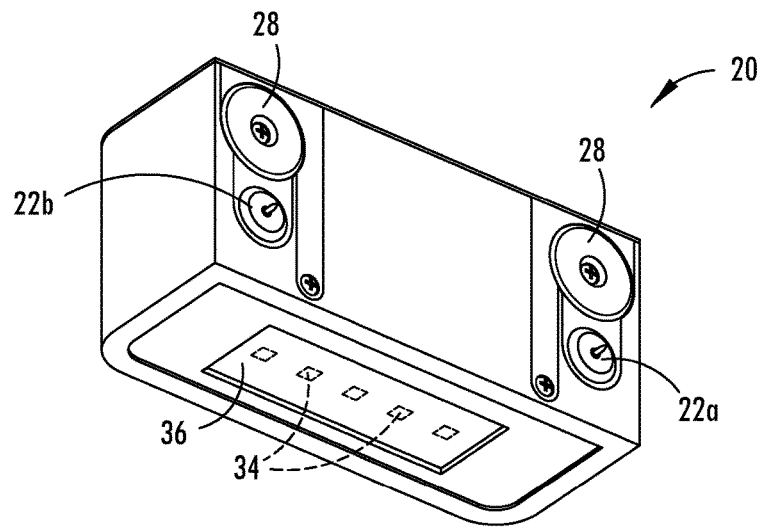
FIG. 7
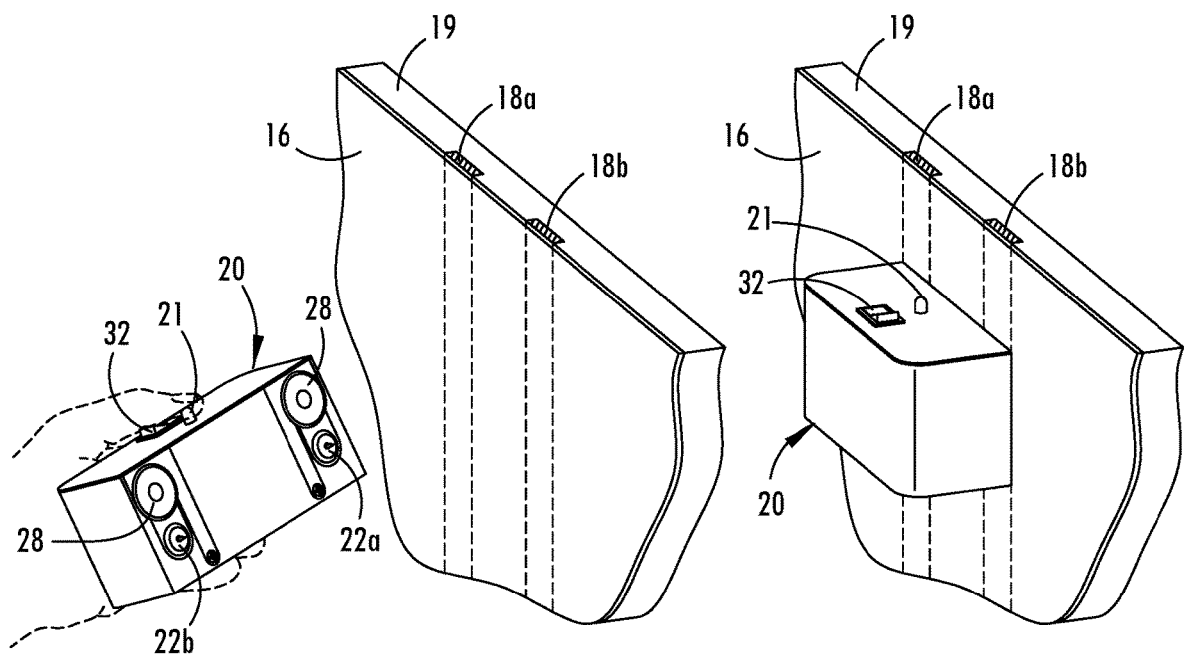
FIG. 8  FIG. 9

CONFIGURABLE LOW VOLTAGE POWER PANEL

CROSS-REFERENCE TO RELATED APPLICATION

This application claims benefit and priority under 35 U.S.C. § 119(e) of U.S. provisional application Ser. No. 62/634,054, filed Feb. 22, 2018, which is hereby incorporated herein by reference in its entirety.

TECHNICAL FIELD

This disclosure generally relates to power distribution systems and, more particularly, to power sources that are configurable to deliver power to one or more accessories, such as for use with office furniture, tack boards, partitions, dividers, and the like.

BACKGROUND

The traditional means to deliver low voltage power to a device is through a power cord connecting the device directly to a power source. It is also relatively common for electrical devices to be powered by rechargeable batteries that occasionally need to be connected to a power source to operate the device or recharge the battery. While wireless charging can provide a recharging power source for some of these devices without the clutter of wires and need to find an appropriate power outlet, the wireless connectivity of today's wireless charging can be inefficient and take longer to charge a device's battery than a direct wired connection. Typically office environments provide low voltage power outlets at inconvenient locations, such as at lower areas of a building wall or along a lower strip of partition walls or the like.

SUMMARY

The present disclosure provides a power distribution system that includes a panel assembly that is capable of engaging one or more application modules at multiple locations on an outer surface the panel assembly, so as to conveniently position the application modules at desirable locations, such as for positioning a component, such as a light or speaker or power outlet, integrated with the application module. The application modules may electrically connect with the engaged locations of the panel assembly so as to power or supply electricity to the integrated component or components of the application modules. The application modules may also be easily disengaged and relocated to other desired locations on the panel assembly, so as to allow for simplistic interchangeability and customization of associated environments, such as permanent and temporary work spaces, waiting areas, educational places, and the like.

According to one aspect of the present disclosure, a power distribution system includes a panel assembly that has an outer surface and two conductive structures spaced from each other and spanning beneath the outer surface. An application module is configured to engage one of a plurality of locations disposed over the outer surface of the panel assembly. The application module includes a first contact configured to engage the first conductive structure and a second contact configured to engage the second conductive structure. The second contact is electrically insulated from the first contact and the first conductive structure for the panel assembly to deliver power to the application module.

According to another aspect of the present disclosure, a power distribution system includes a panel assembly that has an outer panel and an inner panel spaced from outer panel. An application module is configured to attach to one of a plurality of locations disposed over the outer panel of the panel assembly. The application module has a first contact that is configured to engage the outer panel and a second contact that is configured to extend through the outer panel and engage the inner panel. The second contact is electrically insulated from the first contact and the outer panel for the panel assembly to deliver power to the application module when attached to the outer panel. Optionally, the application module may include a magnet that is configured to bias the application module against the outer panel when the first and second contacts are in engagement with the respective outer and inner panels.

According to yet another aspect of the present disclosure, a method is provided for delivering electricity to an application module that is supported at a desired location on a panel assembly. The panel assembly has an outer surface and first and second conductive structures spaced from each other and spanning beneath the outer surface. An application module is positioned at one of a plurality of locations over the outer surface of the panel assembly. A first contact on the application module is engaged with the first conductive structure to form a first electrical connection. A second contact of the application module is passed through the outer surface and into engagement with the second conductive structure to form a second electrical connection insulated from the first electrical connection. The application module may include an attachment feature that, with the first and second contacts in engagement with the first and second conductive structures, is attaching and supporting the application module at the outer surface of the panel assembly.

These and other objects, advantages, purposes, and features of the present disclosure will become apparent upon review of the following specification in conjunction with the drawings.

BRIEF DESCRIPTION OF THE DRAWINGS

FIG. 7 is a rear, lower perspective view of the application module shown in FIG. 2 disengaged from the panel;

FIG. 8 is an upper perspective view of a user holding the application module away from a cut-away section of the panel shown in FIG. 2;

FIG. 9 is an upper perspective view of the application module engaged to the cut-away section of the panel shown in FIG. 8;

DETAILED DESCRIPTION

Figure 1A:
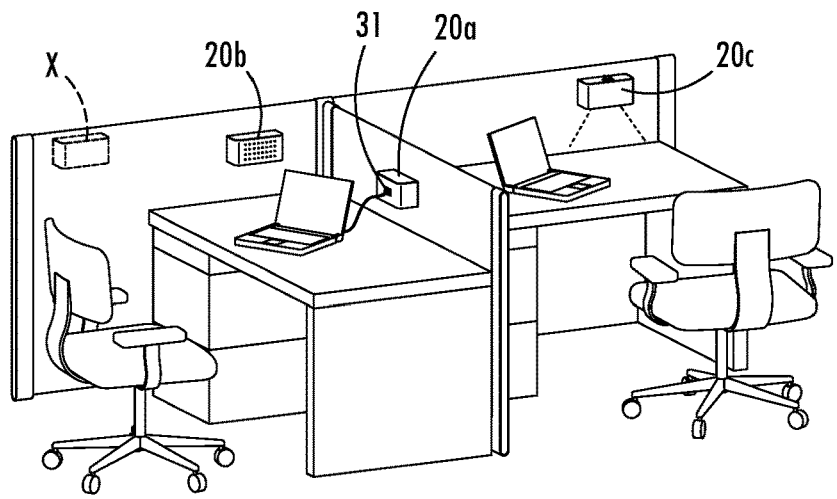
FIGS. 1A-1C are environmental perspective views of various examples of application modules engaged with a panel of a low voltage power distribution system that is integrated with different examples of partitions and panel systems.

Referring now to the drawings and the illustrative embodiments depicted therein, a power distribution system is provided that includes a panel assembly that is capable of receiving and supporting one or more application modules at various engaged locations on the panel assembly, so as to position the modules at desirable locations. The panel assembly may be connected to an auxiliary power source, such as a power supply that is connected to a standard electrical outlet. Alternatively, when an auxiliary power source is disconnected, an engaged application module may be used as a power source for other engaged application modules, such as to backfeed electrical power to the panel assembly. The application modules electrically connect at the locations of the panel assembly it is attached so as to power or deliver electricity to the integrated component or components of the application modules, such as a light, a speaker, or power outlet.

Figure 1B:
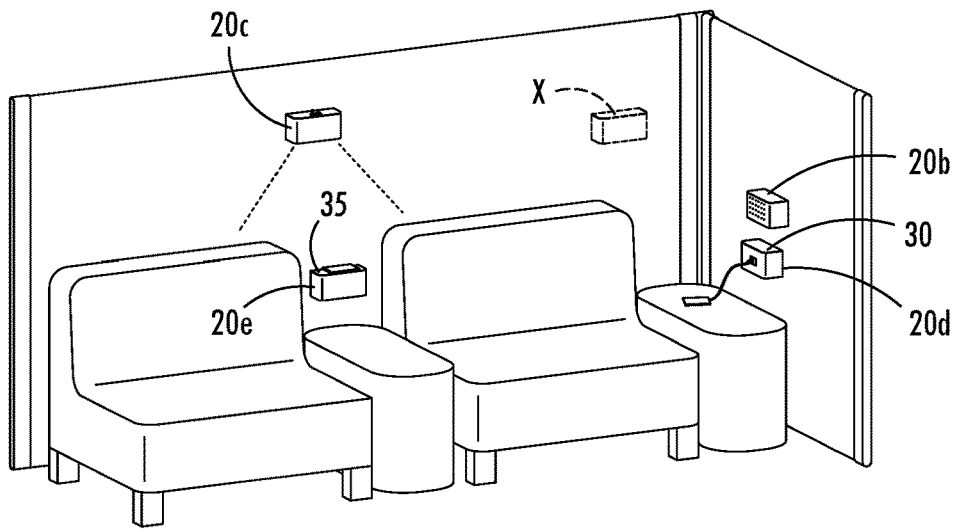
Figure 1C:
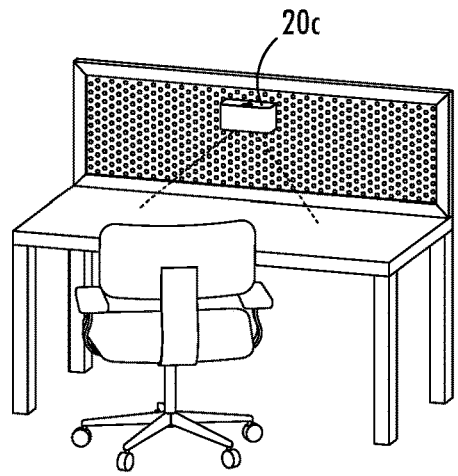

To form the electrical connection with an attached application module, the application module includes a first contact that engages a first conductive structure of the panel assembly and a second contact that engages a second conductive structure of the panel assembly. The second contact is electrically insulated from the first contact and the first conductive structure for the panel assembly to deliver power to the application module. The application modules may also be easily disengaged and relocated to other desired locations on the panel assembly, so as to allow for simplistic interchangeability and customization of associated environments. For example, as shown in FIGS. 1A-1C, the panel assembly may form or be integrated with various partitions and divider wall systems and application modules may be engaged at various locations that may be convenient within such a work station or space or the like.

With reference to FIGS. 2-11, an example of a power distribution system 10 includes a panel assembly 12 that has an inner portion 14 and an insulating cover 16 that is disposed at least partially over an outer surface of the inner portion 14. The inner portion 14 of the panel assembly 12 also includes at least two conductive structures, such as the two conductive members 18a, 18b shown in FIGS. 2-4 at a generally consistent spacing from each other on the panel assembly 12. The two conductive members 18a, 18b are disposed on a panel 19 beneath the insulating cover 16, so as to be arranged between the panel 19 and the insulating cover 16. The separation between the conductive members 18a, 18b allows them to have opposing electrical polarity, so as to be capable of powering an accessory module 20, such as the attached accessory module 20 shown in FIG. 2

Figure 2:
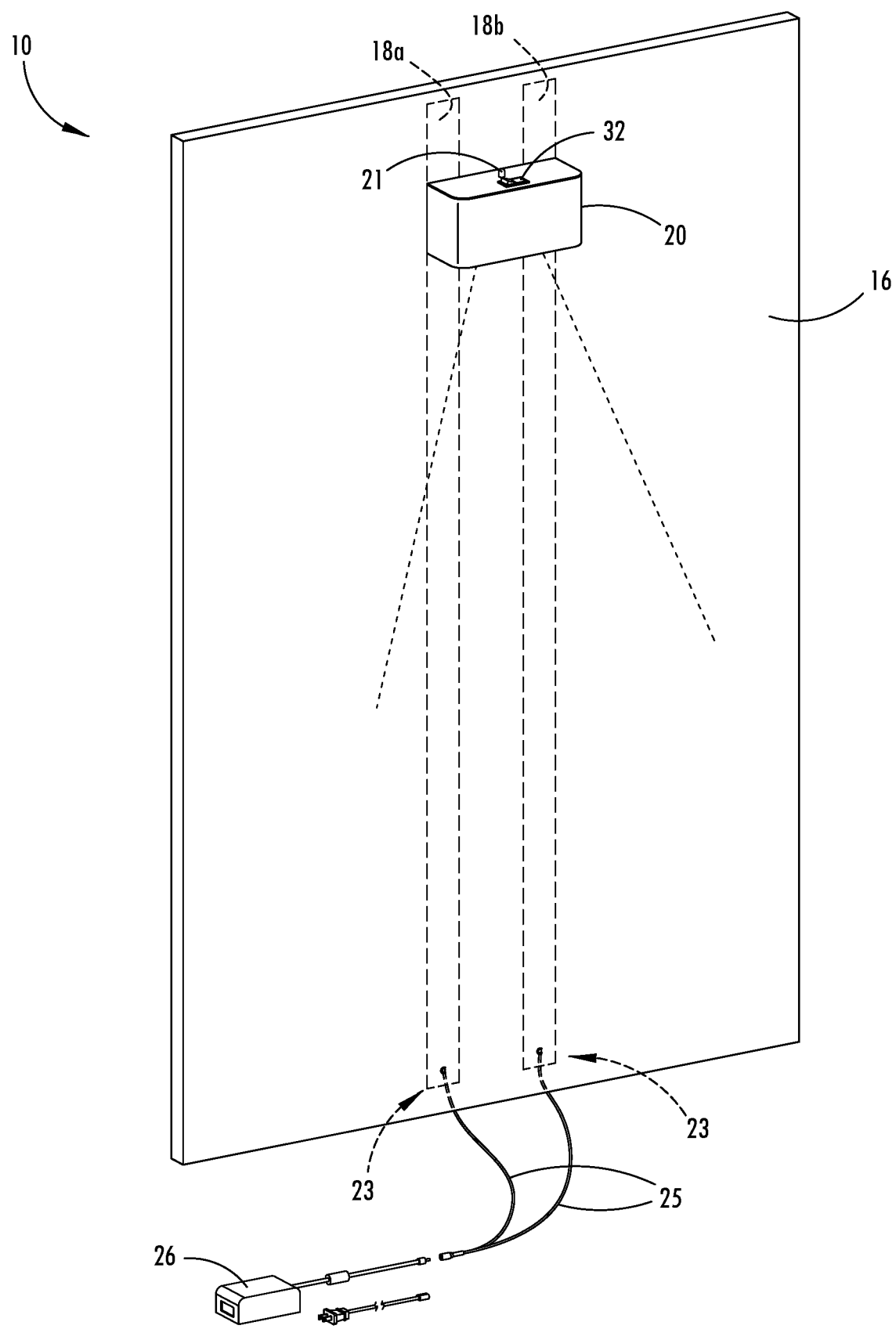
FIG. 2 is a front, upper perspective view of a panel of a low voltage power distribution system having an application module engaged with a front surface of the panel.
Figure 3:
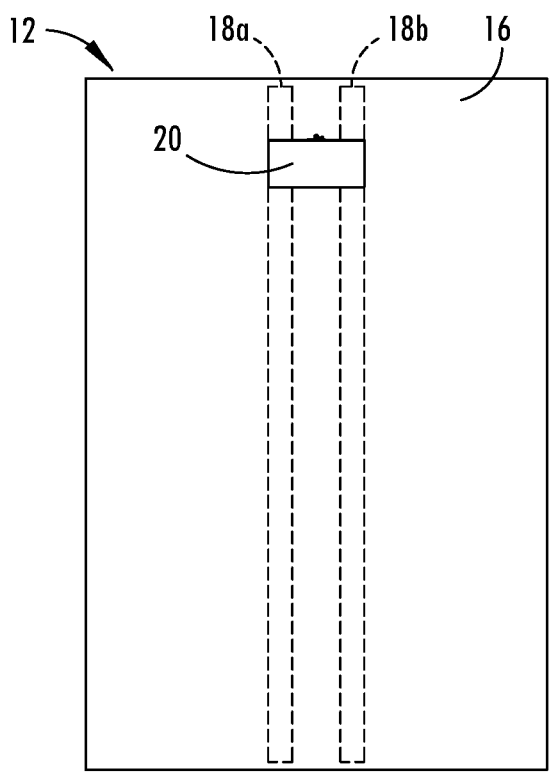
FIG. 3 is a front elevation view of the panel shown in FIG. 2.
Figure 4:
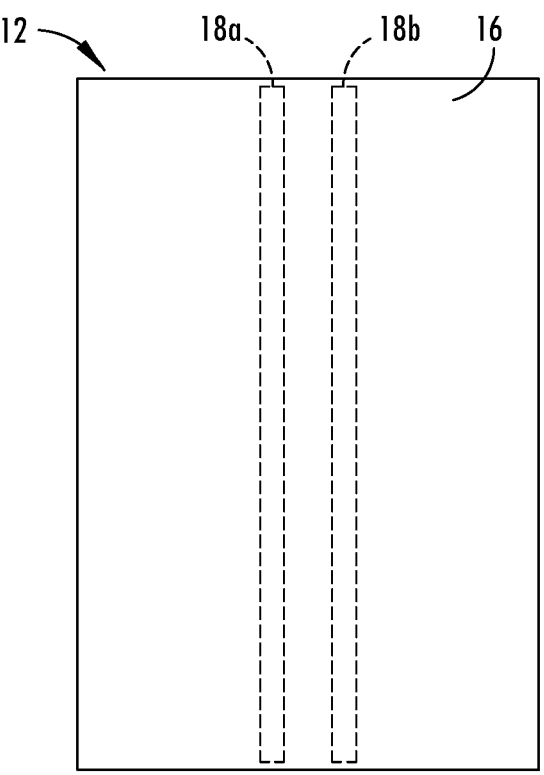
FIG. 4 is a front elevation view of the panel shown in FIG. 2 with the application module removed.
Figure 5:
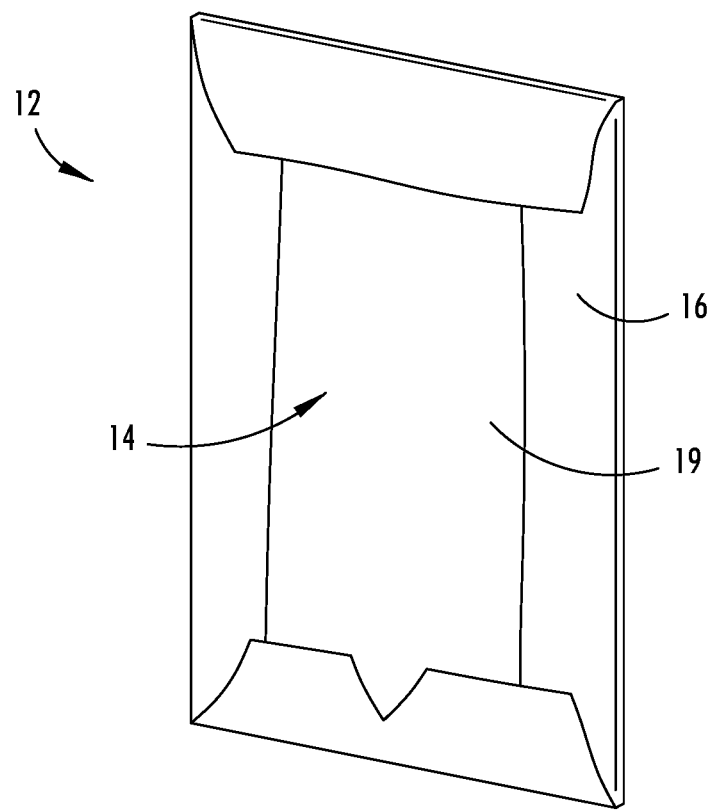
FIG. 5 is a rear perspective view of the panel shown in FIG. 2.

As shown in FIG. 2, the application module 20 may attach to the panel assembly 10 at a desired location where contacts on the application module 20 engage the conductive structures. More specifically, the application module 20, as shown in FIGS. 7-9, has two contact studs 22a, 22b that are disposed on the application module 20 at the same or similar spacing to that provided between the conductive members 18a, 18b. The contact studs 22a, 22b may pierce through the insulating cover 16 and engage one of the conductive members 18a, 18b. Accordingly, the application module 20 may be positioned at any location along the length of the conductive members 18a, 18b where the contact studs 22a, 22b are capable of engaging the respective conductive members to form electrical connections that can deliver power to the engaged the application module 20.

Figure 6:
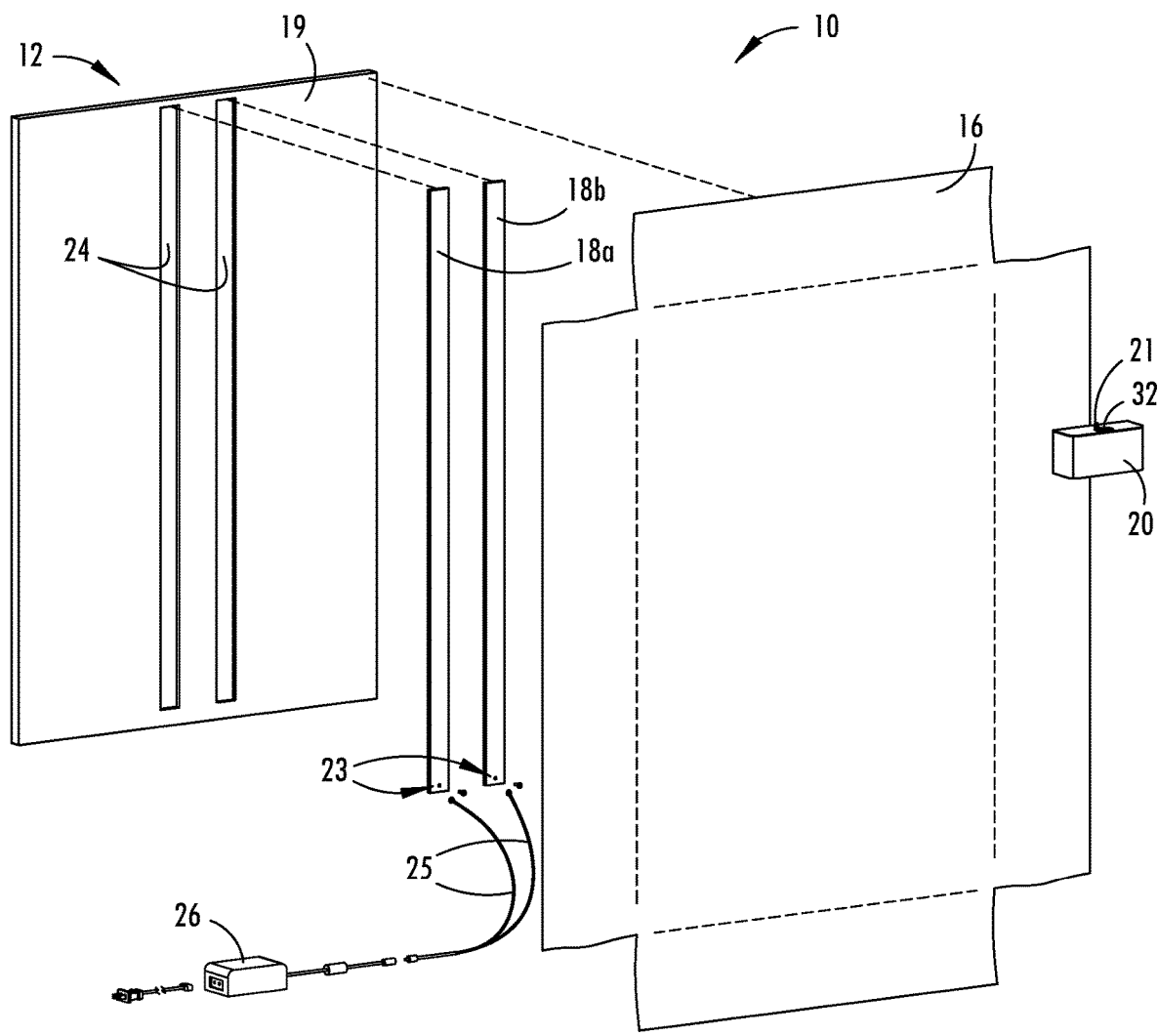
FIG. 6 is an exploded upper, perspective view of the panel and the application module of the low voltage power distribution system shown in FIG. 2.

The panel 19 provided on the inner portion 14 of the panel assembly 12 may be substantially planar and rigid, such as shown in FIG. 6. However, it is also contemplated that the exterior surface of the panel in additional examples may include curvatures or angles to accommodate the overall structure that is integrated with the panel assembly and may be formed with flexible materials. Likewise, although shown as a wooden board, the panel 19 of the panel assembly 12 may comprise additional or alternative electrically insulating materials, such as a plastic, a fiber composite, a cement board, a cork board, a foam board, or the like. As such, the shape and material of the panel assembly 12 may be configured to integrate with the shape and material of office furniture, tack boards, partitions, dividers, and the like, among other conceivable applications, whereby the panel assembly may be a separate unit or an integral piece of a larger structure. For example, panel assemblies are integrated with various partition and divider wall systems in FIGS. 1A-1C to show examples of how application modules may be engaged at various locations that may be convenient within a work station or the like.

As shown in FIG. 6, the panel 19 of the inner portion 14 of the panel assembly 12 may include channels 24 that are formed along the exterior surface in the shape and depth of the conductive members 18a, 18b. As such, the conductive members 18a, 18b may be fit in the channels 24 so as not to substantially protrude from the exterior surface of the panel 19 of the inner portion 14 and provide a generally flush overall exterior surface of the inner portion 14 of the panel assembly 12. With the conductive members 18a, 18b mounted in such a flush arrangement, the outer-facing surface of the conductive members 18a, 18b together with the exterior surface of the panel 19 may form a generally uninterrupted exterior surface, which when concealed by the insulating cover 16, the conductive members may generally become visually and tactilely unnoticeable.

The conductive members 18a, 18b, such as shown in FIGS. 2-6, are provided as metal rails that are configured to deliver power, such as low voltage DC or AC power, to the engaged contact studs 22a, 22b of the application module 20. The metal rails that comprise the conductive members 18a, 18b may be stainless steel, copper, or other electrically conductive materials. The conductive members 18a, 18b are shown arranged centrally on the panel assembly 12 with the length of the members extending in a vertical orientation, although it is understood that the conductive members in additional examples may alternatively be arranged horizontally, diagonally, or any other conceivable orientation. Also, the conductive members 18a, 18b are shown extending generally linearly along their length, although it is contemplated that the conductive members may have a curved or angled shape along their length, such as to correspond with the shape of the panel assembly or overall structure integrated with the power distribution system. The metal rails of the conductive members 18a, 18b shown in FIG. 6 are approximately 0.04 inches thick, 1.75 inches wide, and roughly 48 inches in length; although it is understood that rails in other examples may be various sizes to accommodate various alternative structures and applications.

Further, as shown in FIGS. 2 and 6, the lower ends of the conductive members 18a, 18b include terminal connection features 23 that are configured to attach to wires 25 that lead to a power supply 26 of the power distribution system 10. Specifically, the wires 25 have a ring crimp terminal that is fastened to an aperture at the lower ends of the metal rails, such as with screws or the like. Other forms of terminal connection and are also contemplated to use in connecting a power supply or power source to the conductive members. The power supply 26 may be a class 2 power supply that reduces the connected voltage to 24 volts, where the connected voltage may be 120 volts supplied by a standard electrical outlet. It is understood that the other examples of the power supply may deliver different voltage level and may be direct current (DC) or alternating current (AC) to similarly supply power to the panel assembly. Alternatively, when an auxiliary power source is disconnected, an engaged application module may be used as a power source for other engaged application modules, such as to backfeed electrical power to the panel assembly.

As shown in FIGS. 2-6, the insulating cover 16 may include a fabric that has several openings configured to receive the contact studs 22a, 22b of the application module 20. The fabric may be woven to provide warp and weft filaments to define a grid pattern and may be woven loose enough to allow the openings in the woven fabric to expand upon insertion of the contact studs 22a, 22b through the fabric. Similarly, the fabric may be resilient so that the openings generally retract to a natural state upon removal of the contact studs from the fabric. Also or alternatively, the insulting cover may include other non-woven materials or fabric materials, such as leather, polyamide, polyester, silicone, mesh, or other natural or synthetic covering materials that may be formed with slits or openings that are sufficiently sized to be engaged by the contact studs of an application module. The insulating cover may be secured in place with an adhesive or fastener or the like to generally prevent movement of the cover relative to inner portion of the panel assembly.

Figure 11:
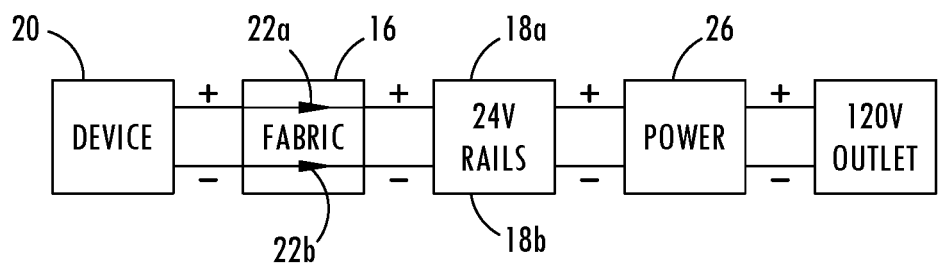
FIG. 11 is schematic block diagram of the low voltage power distribution system shown in FIG. 2.

As shown in FIGS. 7-9, the contact studs 22a, 22b of the application module 20 extend through the insulating cover 16 and each engaging one of the conductive members 18a, 18b at a location along the length of the conductive members 18a, 18b. Upon engaging the conductive members 18a, 18b embedded under the insulating cover 16, the application module 20 is placed in electrical connection with the power supply, such as shown in FIG. 11. When power is delivered to the panel assembly 12 and the application module 10 has made an electrical connection with the panel assembly 12, an indicator, such as the illustrated indicator light 21 (FIG. 9) may illuminate or otherwise notify a user of the electrical connection. The conductive members 18a, 18b may thereby deliver the low voltage power to the engaged contact studs 22a, 22b of the application module 20.

Figure 10:
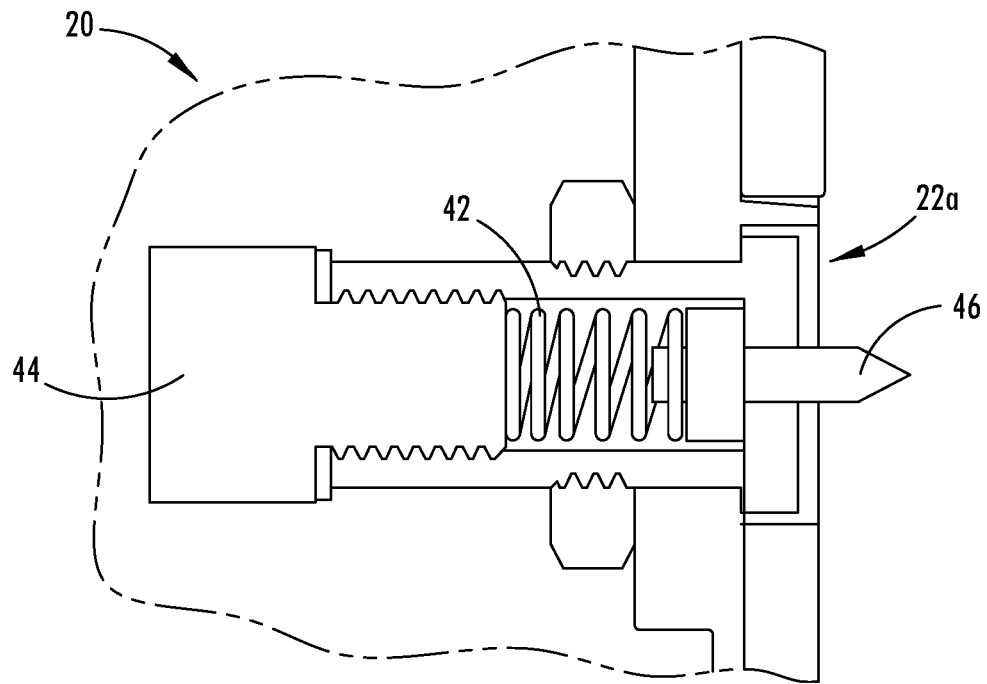
FIG. 10 is a cross-sectional view of a section of the application module shown in FIG. 7, showing a spring-loaded contact stud configured to engage the panel.

To facilitate a stable and consistent electrical connection with the device or module, a spring pin assembly may be provided on or within the module. As shown in FIG. 10, a spring pin assembly 40 includes a spring 42 that may carry current to a wire connector 44 that engages a wire to electrically connect to the module's electrical components from a shank 46 that pierces through the fabric or insulating cover to contact the conductive members. The spring 42 may also absorbs potential movement of the module due to movement of the overall structure, such as a furniture piece, and may compensate for tolerance differences in the spacing and depth of the conductive members. Accordingly, the spring may be used entirely for mechanical biasing purposes and wires or other conductive elements may be used to transfer current from the shank to the module's electrical components.

To hold and support the application module 20 at the panel assembly 12, and also to maintain the electrical connection of the contact studs 22a, 22b with the conductive members 18a, 18b, the application module 20 may include an attachment feature, such as a fastener, magnet, clip, or the like, that is configured to engage the outer surface of the panel assembly 12. As shown in FIGS. 7 and 8, the attachment feature of the application module 20 is provided as two magnets 28 that are configured to align with the conductive members 18a, 18b so as to physically bias the application module 20 against the outer surface of the panel assembly 12. The magnets 28 magnetically attach to the metal rails of the conductive members 18a, 18b when the contact studs 22 are also in engagement with conductive members 18a, 18b. By aligning the magnet 28 with the metal rails, no additional metal features are needed on the panel assembly 12 to effectuate the magnetic connection with the magnets that supports the application module 20 at the panel assembly. In addition to or in the alternative to magnets aligned with conductive members of the panel assembly, it is contemplated that a magnet may be disposed on an application module so as to position the magnet outside or between the conductive members, such as to magnetically connect with a different metal structure on the panel assembly.

The application module 20 may include various components or combinations of components to provide the desired functionality of the module 20. As also shown in FIGS. 7-9, the application module 20 provides a switch 32 at the upper surface of the module 20 for actuating a light source 34. The light source 34, as shown in FIG. 2, is operable to direct light downward through the lower surface of the module 20, such as to illuminate a work area or surface. The light source 34 is shown in FIG. 2 as an array of light-emitting diodes (LEDs) that illuminate through a transparent substrate 36, such as a glass or plastic lens or cover. It is also contemplated that the device or module 20 may be equipped with additional or alternative components, such as speakers, displays, control circuitry, wireless connectivity chips, or the like.

As shown in FIGS. 1A-1C, the application modules may be engaged at various locations on various types of panel assemblies, such as to be in the desired location within the surrounding environment. For example, as shown in FIG. 1A, three different types of modules 20a, 20b, 20c are shown. A power outlet module 20a provides a power outlet 31 for connecting a laptop computer, and may also be capable of powering other similarly connected devices. The work station that has the power outlet module 20a is also provided with a speaker module 20b engaged to an adjacent work station partition panel that may be part of the power distribution system powering the panel engaged by the power outlet module 20a. The speaker module 20b may receive signals to operate the speaker from contemplated various sources, such as on-board memory or an on-board receiver, such as for radio, Bluetooth, Wi-Fi other wireless signals. As further shown in FIG. 1A, a task lighting module 20c is shown engaged to a panel assembly in a location above a work surface, such that the light source of the lighting module 20c may illuminate the working surface. FIGS. 1A-1C also illustrate exemplary additional attachment locations X of the multitude of available attachment locations to receive one of the illustrated accessory modules or to attach an additional accessory module.

With reference to FIG. 1B, two additional types of modules 20d, 20e are shown attached to another example of a power distribution system. A power module 20d provides two universal serial bus (USB) ports 30 for connecting with devices that are capable of being powered or charged via such a USB connection. It is conceivable that in addition to or in place of the USB port, the module may have power outlets or receptacles or ports that are configured for different connection types, such as with different accessory cords or the like. Furthermore, a charging module 20e is shown that provides a support surface or features, such as to support other items or devices. The charging module 20e includes an upper support surface 35 that is configured with an inductive charger to inductively couple with a wireless device having such wireless power and/or data transmission capabilities.

Figure 12:
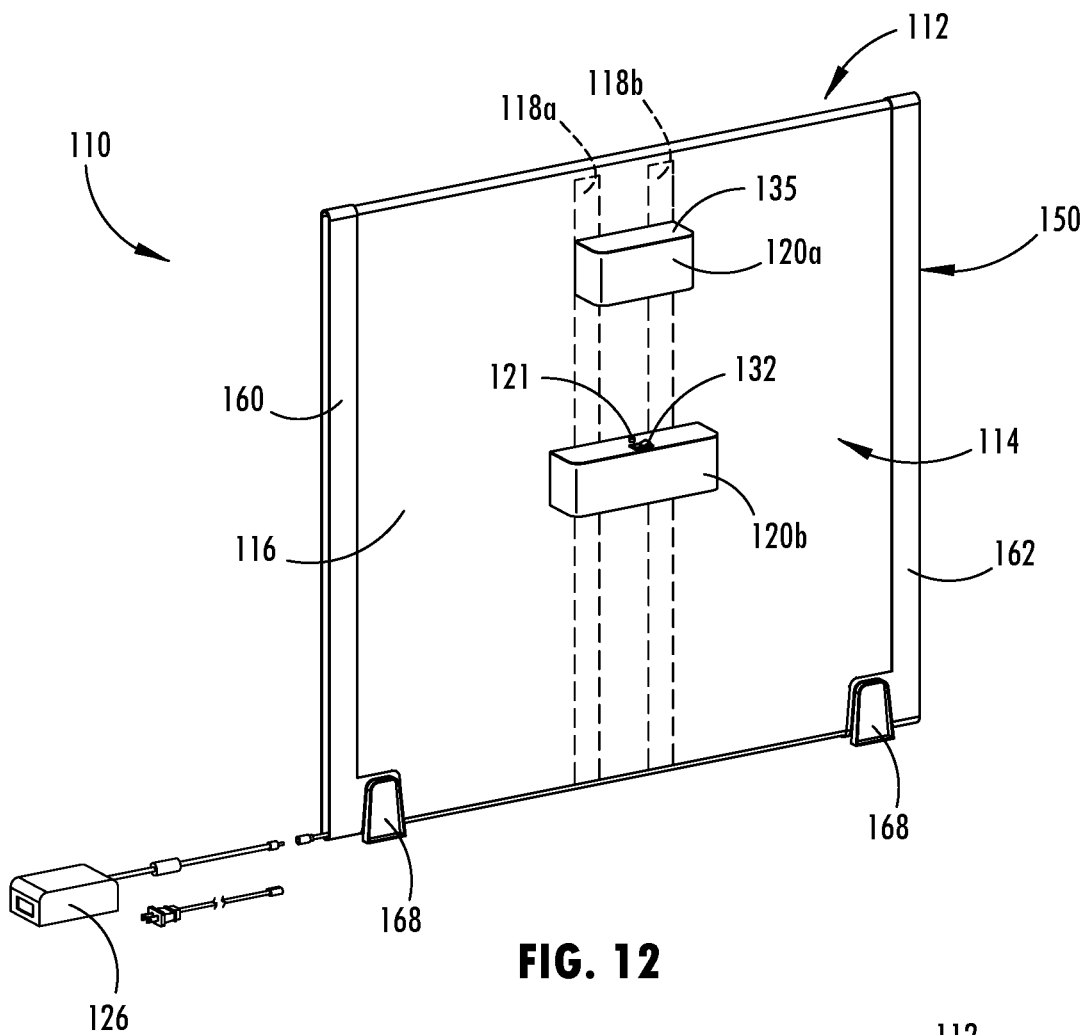
FIG. 12 is a front, upper perspective view of an additional example of a panel of a low voltage power distribution system, showing two application modules engaged to the panel.
Figure 13:
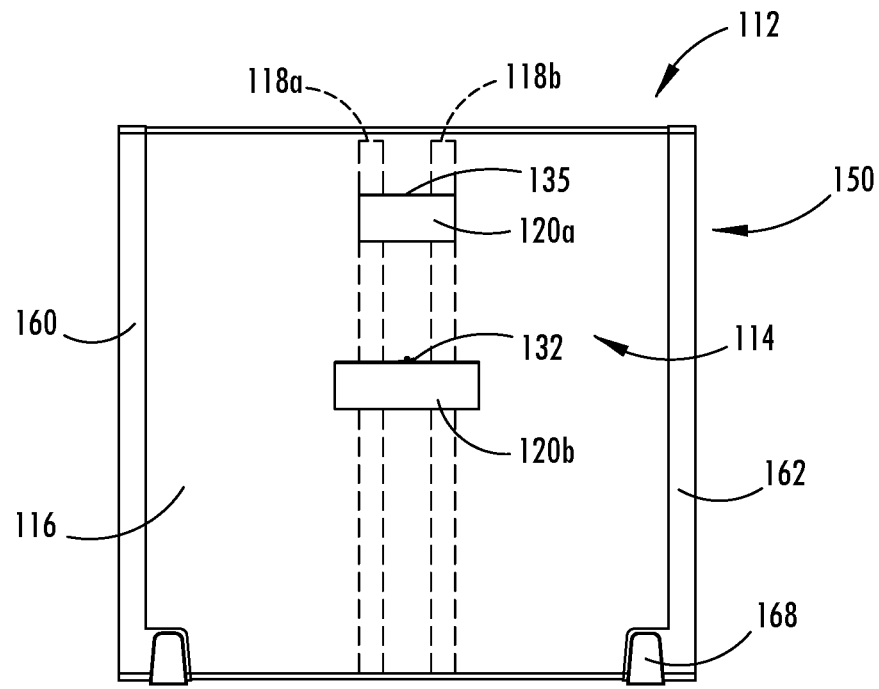
FIG. 13 a front elevation view of the panel shown in FIG. 12.
Figure 14:
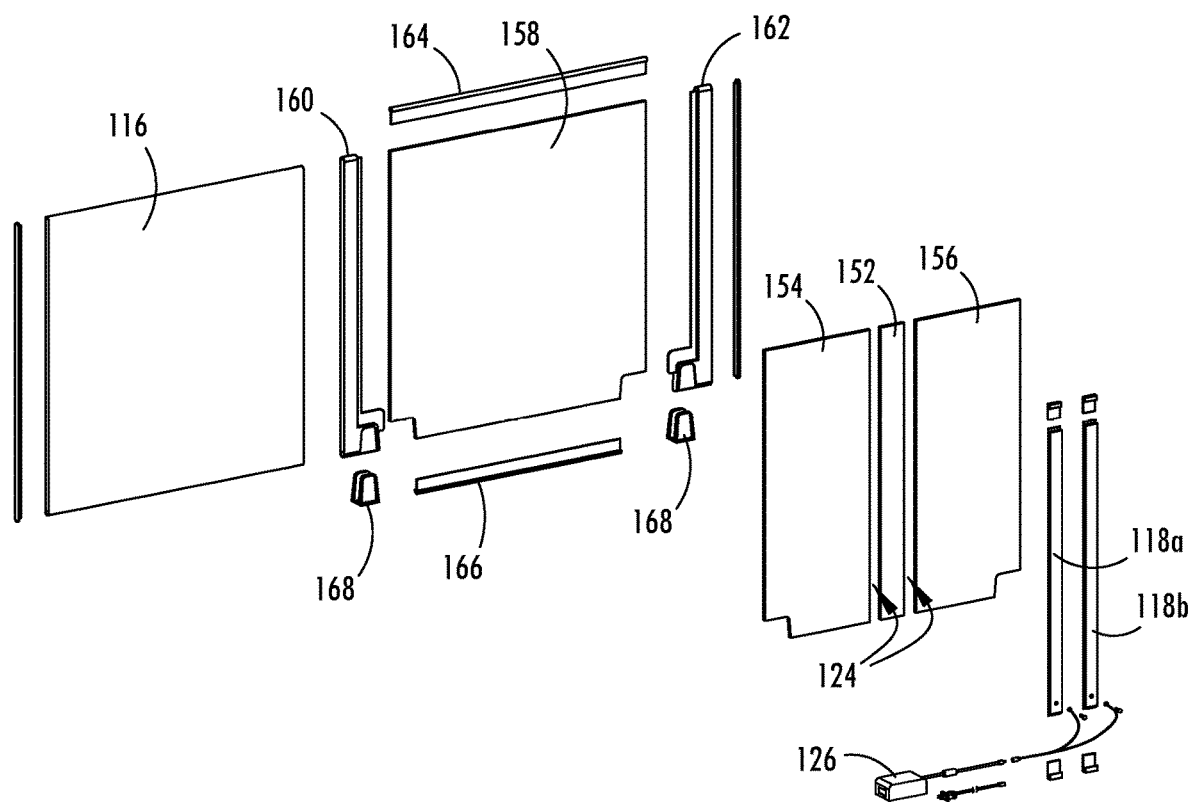
FIG. 14 is an exploded upper, perspective view of the panel shown in FIG. 12.

With reference to FIGS. 12-14, an additional example of a panel assembly 112 is shown that has an inner portion 114 with a frame 150 that borders several panel pieces 152, 154, 156, 158 to hold them together and in the desired alignment. The panel pieces include two front-facing exterior panels 154, 156 that border the outside lateral edges of the conductive members 118a, 118b. A front-facing interior panel 152 is disposed between the two front-facing exterior panels 154, 156 and borders the inside lateral edges of the conductive members 118a, 118b. These front-facing interior and exterior panels 152, 154, 156 together with the conductive members 118a, 118b form a front section of the inner portion 114 that is disposed against a rear-facing panel 158 and may be attached thereto, such as via an adhesive or fastener or the like. The outer frame 150 attaches around the peripheral edge of the assembled panel pieces to hold the panel pieces securely together. The outer frame 150, such as shown in FIG. 14, may have lateral members 160, 162 that engage over and along the lateral outside edges of the panel pieces and upper and lower members 164, 166 that engage over and along the respective upper and lower edges of the panel pieces. The outer frame may also incorporate feet 168 that support the outer frame 150 upright, such as shown at the lateral members of the outer frame in FIGS. 12-14.

As shown in FIG. 14, the inner portion 114 of the panel assembly 112 provides channels 124 between the front-facing interior and exterior panel pieces 152, 154, 156, to allow the conductive members 118a, 118b to set in the channels 124 and be generally flush with the exterior surface of the front-facing interior and exterior panel pieces 152, 154, 156 that are immediately adjacent to the channels 124. With the conductive members 118a, 118b mounted in such a generally flush arrangement, the outer-facing surface of the conductive members 118a, 118b together with the exterior surface of the front-facing interior and exterior panel pieces 152, 154, 156 may form a generally uninterrupted exterior surface. An insulating cover 116 may be disposed at least partially over the inner portion 114 to conceal the conductive members 118a, 118b and panels, such that the cover 116 may define the outer surface of the panel assembly 112.

The conductive members 118a, 118b, such as shown in FIGS. 12-14, may include metal rails, which may comprise stainless steel or other conductive metals, which are configured to deliver low voltage DC or AC power to the engaged contact studs of the engaged application module 120. As also shown in FIGS. 12 and 14, the end sections of the conductive members 118a, 118b may include insulating caps that attach to and conceal the ends of the rails. Also, the lower ends of the conductive members 118a, 118b shown in FIG. 14 include terminal connection features that are configured to attach to wires that lead to a power supply 126 of the power distribution system 110.

As further shown in FIGS. 12-14, the insulating cover 116 may include a woven fabric that defines a plurality of openings configured to receive the contact studs of the application module. The insulating cover 116 is disposed over the exposed front and rear surfaces of the inner portion of the panel assembly 112, so as to substantially conceal the upper and lower members 164, 166 of the exterior frame, along with the panel pieces 152, 154, 156, 158. The insulating cover 116 may keep the lateral members 160, 162 of the outer frame 160 exposed. The insulating cover 116 may be secured in place with an adhesive or fastener or the like to generally prevent movement of the cover relative to inner structure of the panel assembly.

Figure 15:
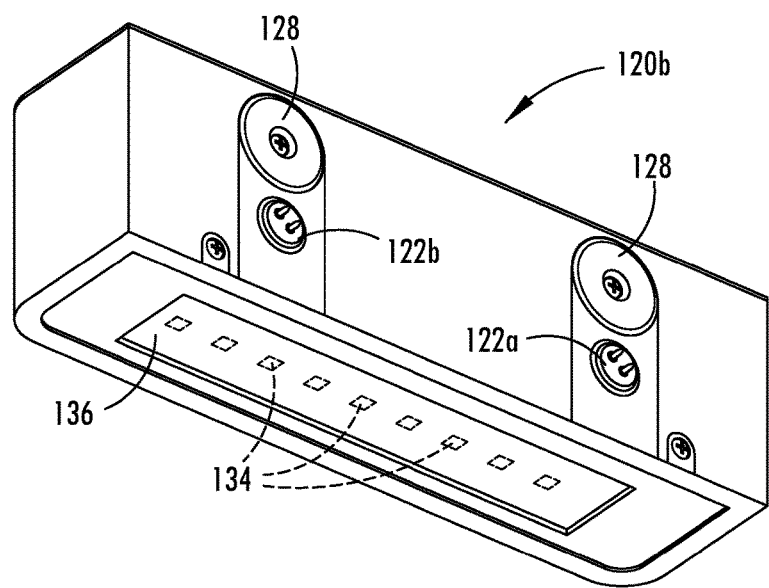
FIG. 15 is a rear, lower perspective view of one of the application modules shown in FIG. 12 disengaged from the panel.

As shown in FIG. 12, two accessory modules 120a, 120b are attached to the outer surface of the panel assembly 112. The application module 120a provides an upper support surface 135 that is configured with an inductive charger to inductively couple with a wireless device having such wireless power and/or data transmission capabilities. The application module 120b attached to the panel assembly 112 below the application module 120a provides a switch 132 at the upper surface of the module 120b for actuating a light source 134. As shown in FIG. 15, the light source 134 is operable to direct light downward through the lower surface of the module 120b, such as to illuminate a work area or surface. The light source 134 is an array of light-emitting diodes (LEDs) that illuminate through a transparent substrate 136, such as a glass or plastic lens or cover. It is also contemplated that the application module or modules used with the system 110 shown in FIGS. 12-14 may be equipped with additional or alternative components, such as speakers, displays, control circuitry, wireless connectivity chips, or the like.

As further shown in FIG. 15, the application module 120b has contact studs 122a, 122b that are needle-shaped to easily pierce through the insulating cover 116 of the panel assembly 112 shown in FIGS. 12-14. The insulating cover 116 may be a fabric without accessible openings or with a relatively tight weave, such that the contact studs 122a, 122b may pierce through the insulating cover 116 to each engage one of the conductive members 118a, 118b at a desired location along the length of the conductive members 118a, 118b. Upon engaging the conductive members 118a, 118b embedded under the insulating cover 116, the application module 120b makes an electrical connection with the panel assembly 112, such that an indicator light 121 on the application module 120b (FIG. 12) may illuminate to notify a user of the electrical connection. The conductive members 118a, 118b may thereby deliver the low voltage power to the engaged contact studs 122a, 122b of the application module 120.

To hold and support the application modules 120a, 120b at the panel assembly 112, and also to maintain the electrical connection of the contact studs with the conductive members 118a, 118b, the application modules 120a, 120b may each include an attachment feature, such as a fastener, magnet, clip, or the like, that is configured to engage the outer surface of the panel assembly 12. As shown in FIG. 15, the attachment feature of the application module 120b is provided as two magnets 128 that are configured to align with the conductive members 118a, 118b so as to physically bias the application module 120b against the outer surface of the panel assembly 112. The magnets 128 magnetically attach to the metal rails of the conductive members 118a, 118b when the contact studs 122a, 122b are also in engagement with conductive members 118a, 118b.

Figure 16:
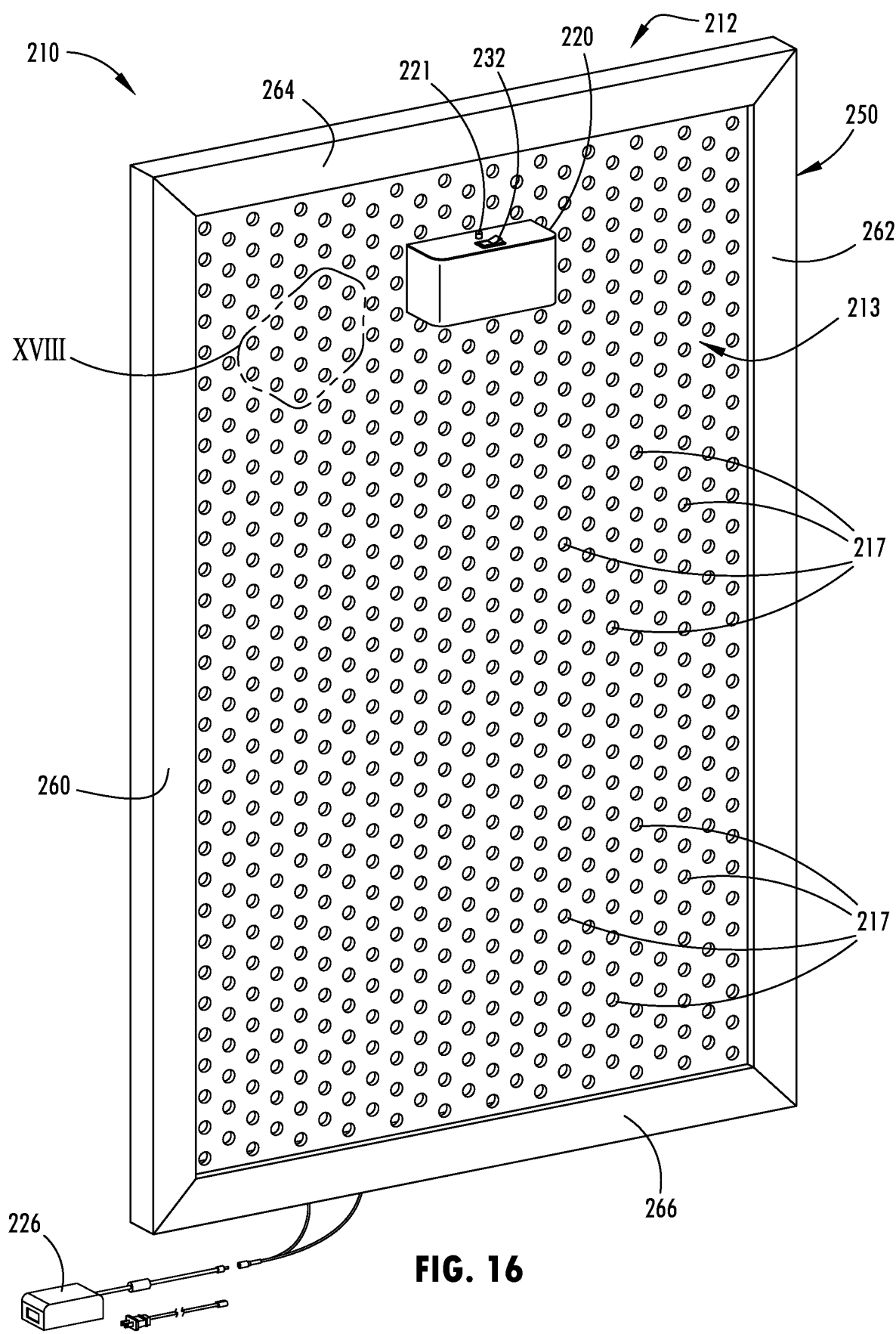
FIG. 16 is a front, upper perspective view of an additional example of a panel of a low voltage power distribution system, showing an application module engaged to the panel.
Figure 17:
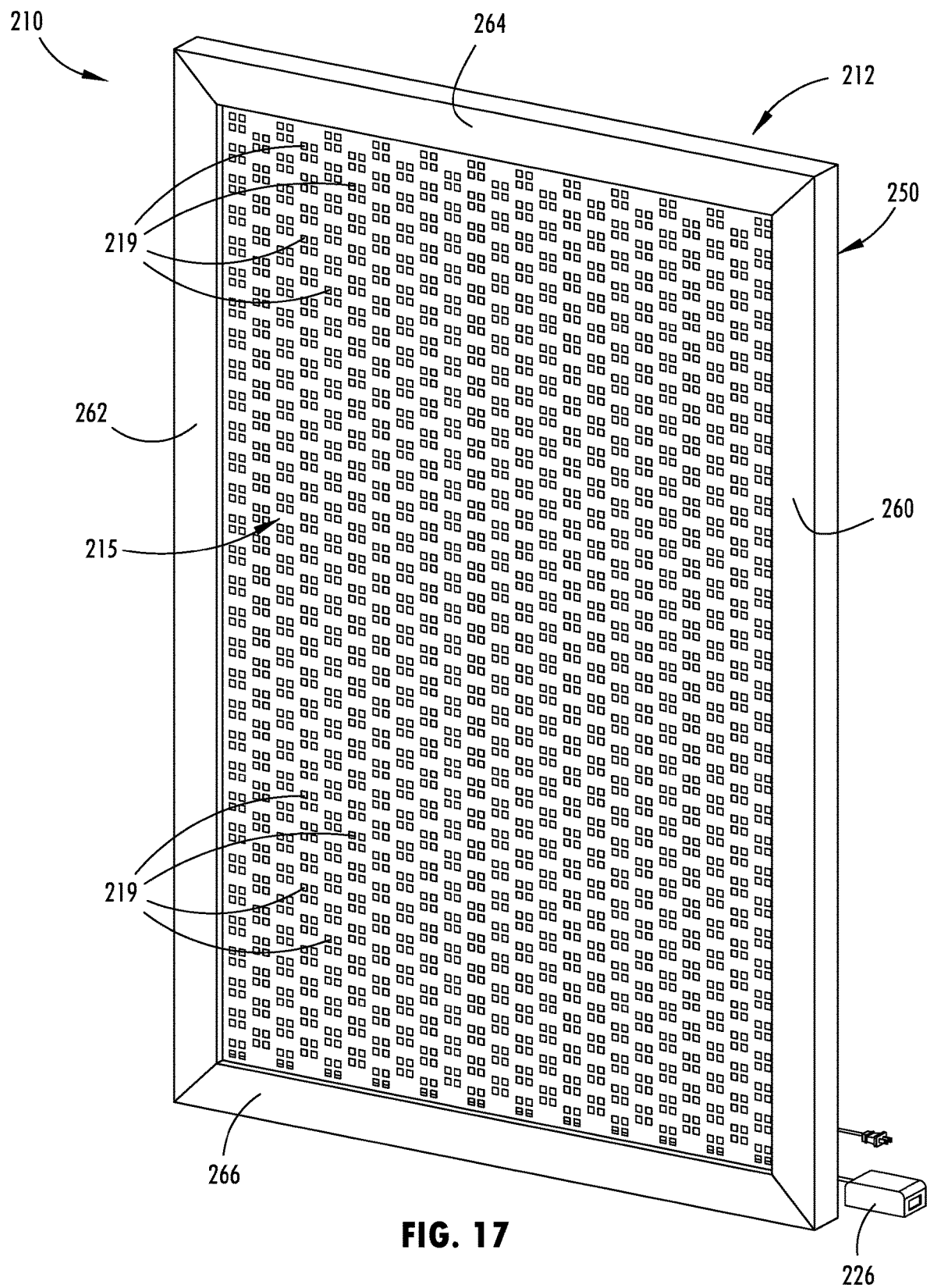
FIG. 17 is a rear, upper perspective view of the panel shown in FIG. 16.

With reference to an additional example shown in FIGS. 16-20, a power distribution system 210 may include a panel assembly 212 that has an outer conductive panel 213 and an inner conductive panel 215 spaced from each other. The outer and inner panels 213, 215 span beneath the outer surface of the panel assembly 212, which may be defined by the outer surface of the outer panel 213 or a protective layer or insulated fabric disposed over the outer an inner panels. As shown in FIGS. 16 and 17, an outer frame 250 attaches around the peripheral edge of the assembled panels 213, 215 to hold the panels 213, 215 at a spaced distance from each other. The outer frame 250, has lateral members 260, 262 that engage along the lateral outside edges of the panels 213, 215 and upper and lower members 264, 266 that engage along the respective upper and lower edges of the panels 213, 215. It is also contemplated that the outer frame may also incorporate feet that support the outer frame upright, or may otherwise be integrated in another structure or furniture piece.

The outer and inner panels 213, 215 may be substantially planar and oriented in planar parallel alignment with each other, such as shown in FIGS. 16 and 17. It is also contemplated that other examples of the panels may be curved or have angular transition and may still be provided in spaced parallel alignment. Also, the panel assembly 212 may include an insulating spacer disposed between the panels 213, 215 to maintain the spacing away from each other, such as with an electrically insulating stand-off piece or substrate layer disposed between the outer and inner conductive panels 213, 215. Alternatively, the panels 213, 215 may be insulated from each other by an air gap, which may be maintained by the rigidity of the panels 213, 215 and the structure of the outer frame 250.

Figure 19:
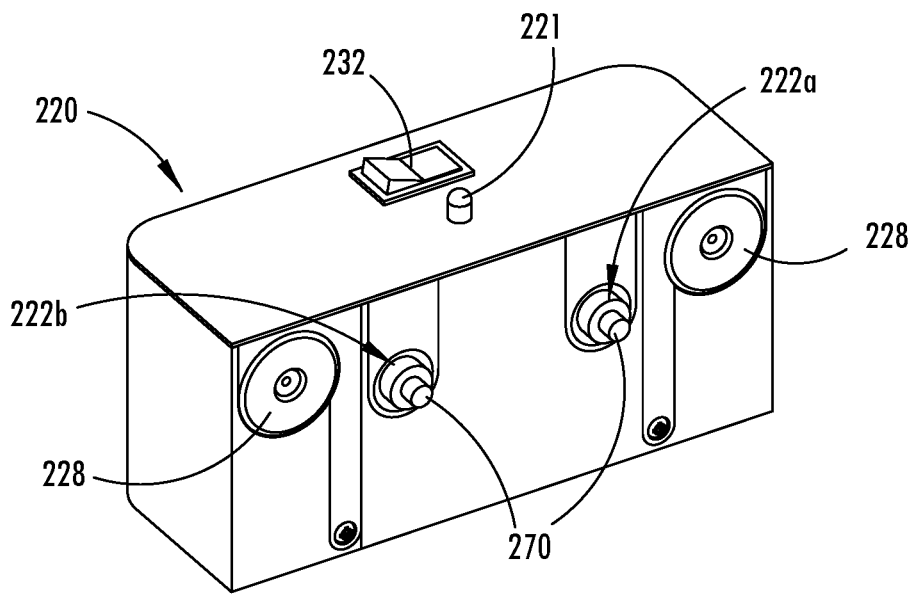
FIG. 19 is a rear, upper perspective view of the application module shown in FIG. 16 disengaged from the panel.
Figure 20:
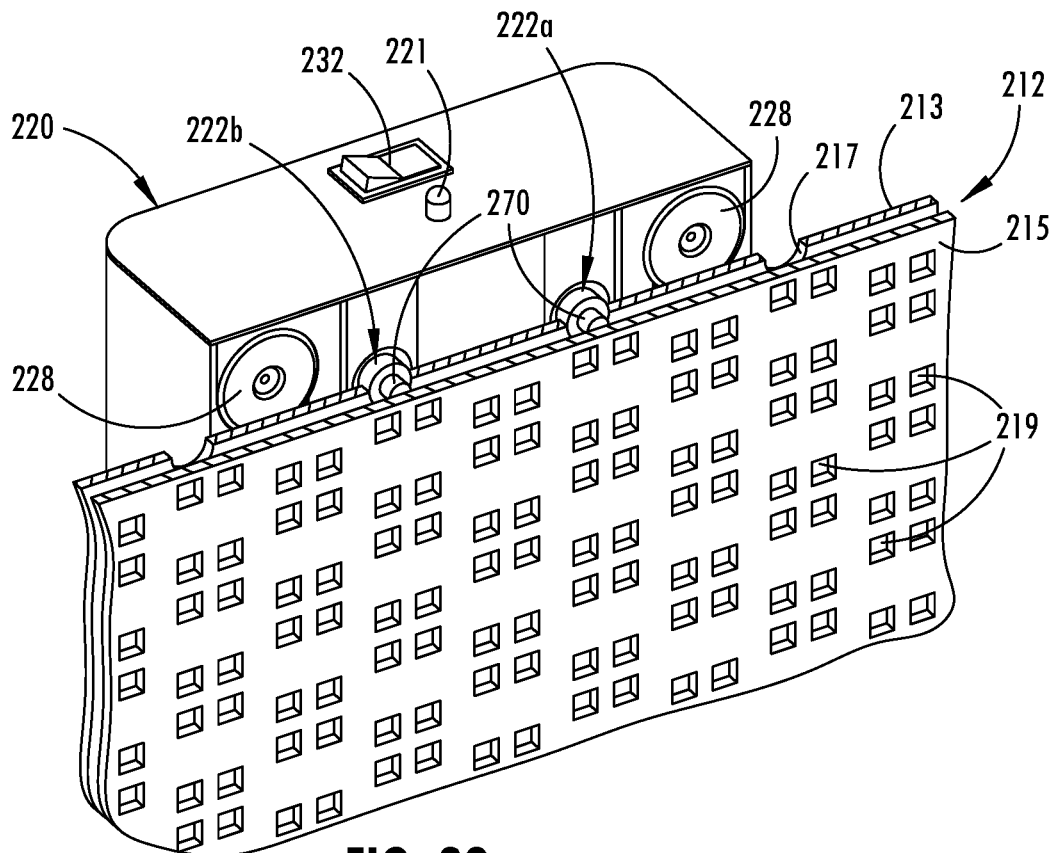
FIG. 20 is a rear, upper perspective view of the application module shown in FIG. 16 and a cut-away section of the panel engaged by the application module.

As shown in FIG. 16, an application module 220 may attach to one of a plurality of locations disposed over the outer panel 213 of the panel assembly 212. As shown in FIGS. 19 and 20, the application module 220 engages and forms an electrical connection with the panel assembly 212 with a first contact engaging the outer panel 213 and a second contact extending through the outer panel 213 and engage the inner panel 215. The first and second contacts on the accessory module 220 are electrically insulated from each other, so that the panel assembly can deliver power to the application module 220 via the first and second contacts. The first and second contacts may be disposed on separate contact studs 222a, 222b, such as shown in FIGS. 19 and 20, where a first contact stud 222a engages the outer conductive panel 213 and a second contact stud 222b extends through an opening in the outer panel 213 to engage and make electrical contact with the inner conductive panel 215.

Figure 18:
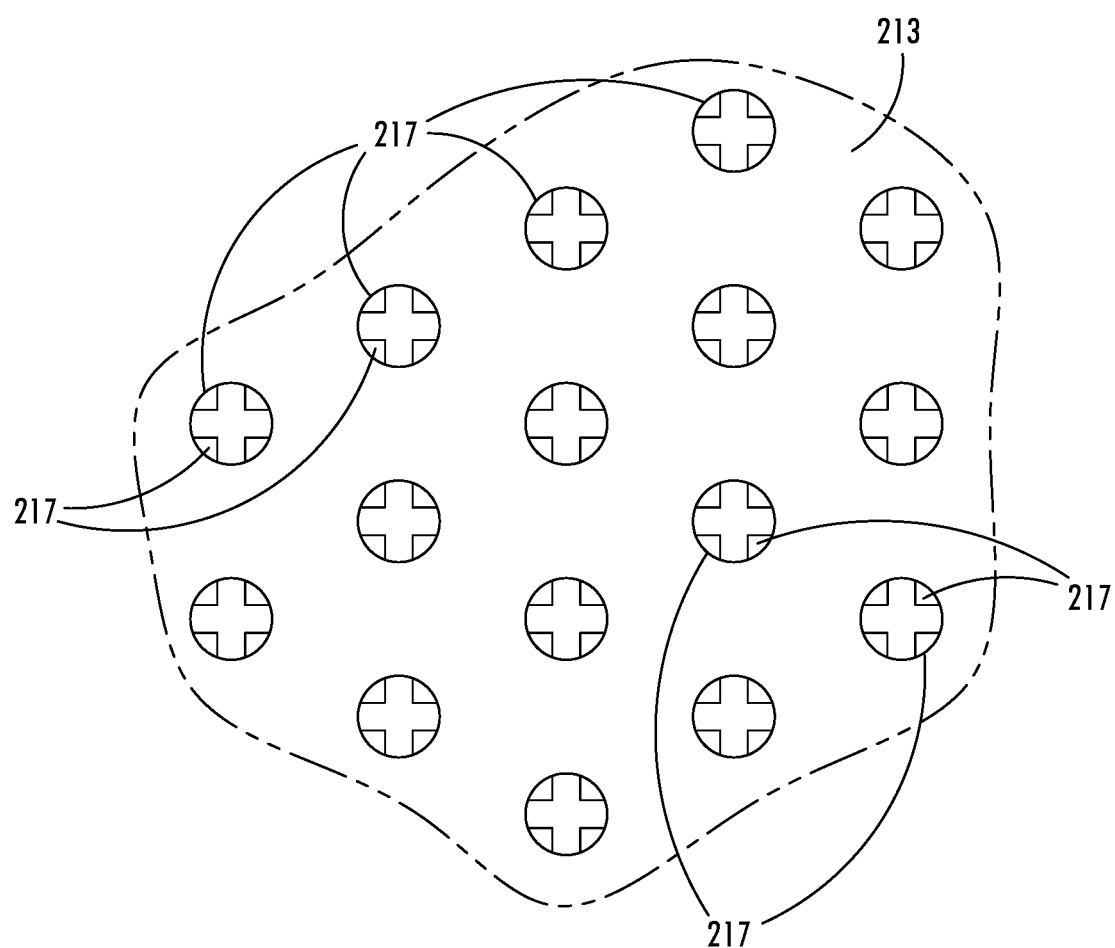
FIG. 18 is a front elevation view of section XVIII of the panel shown in FIG. 16.

As shown in FIG. 16, the outer conductive panel 213 has openings 217 that allow the contact studs 222a, 222b to engage a plurality of locations, both vertically and horizontally, over the panel assembly 212. The openings 217 disposed over the outer conductive panel 213 may define the plurality of locations for engaging the application module 220. As shown in FIG. 16, the openings 217 in the outer panel 213 may have a shape that corresponds with the shape of the contact studs 222a, 222b, such as a circular hole. As shown in FIG. 17, the rear panel 215 may also include openings 219 and those openings may be shaped differently than the openings in the outer panel 213, such as square hole. As shown in FIG. 18, the openings in the outer and inner panels 213, 215 may be misaligned, such that the contact studs 222a, 222b that are is inserted through the outer panel 213 do not extend through the rear or inner panel 215.

As shown in the application module 220 illustrated in FIGS. 19 and 20, the first contact stud 222a has an insulating portion 270 at the tip portion of the stud that engages the inner panel 215, such that no electrical connection is made between the first contact stud 222a and the inner panel 215. Likewise, the second contact stud 222b has an insulating portion 270 at the base portion of the stud that engages the outer panel 213, such that no electrical connection is made between the second contact stud 222b and the outer panel 213. Thus, the first contact stud 222a engages the outer conductive panel 213 and the second contact stud 222b engages the inner conductive panel 215. The application module 220 shown in FIGS. 19 and 20 also includes magnets 228 that are configured, with the contact studs in engagement, to bias the application module 220 against the outer surface of the panel assembly 212. The outer and inner panels 213, 215 comprise metal, such as stainless steel, copper, or other conductive metals that are configured to deliver low voltage power to the engaged contact studs 222a, 222b of the application module 220.

As shown in FIGS. 19 and 20, the application module 220 includes a switch 232 at the upper surface of the module 220 for actuating the a component of the module, such as a light source, speakers, displays, control circuitry, wireless connectivity chips, or the like. Upon engaging the conductive members or panels 213, 215, the application module 220 makes an electrical connection with the panel assembly 212, such that an indicator light 221 on the application module 220 (FIG. 20) may illuminate to notify a user of the electrical connection. The conductive panels 213, 215 may thereby deliver the low voltage power to the engaged contact studs 222a, 222b of the application module 220.

Referring now to FIGS. 21-24, another example of a power distribution system 310 includes a panel assembly 312 that has an outer conductive panel 313 and an inner conductive panel 315 spaced from outer panel 313. An application module 320 is configured to attach to one of a plurality of locations disposed over the outer panel 313 of the panel assembly 312. As shown in FIGS. 21-24, the inner conductive panel 315 of the panel assembly 312 generally does not have any holes or openings, at least at the central portion of the inner conductive panel 315 that is aligned with the openings 317 disposed through the outer conductive panel 313. Instead, the inner conductive panel 315 is a generally planar sheet of metal, which prevents rear access to the front or outer panel 313 and over insertion of the contact stud through the outer panel 313. Also by being free of openings, the inner conductive panel 315 may be easily used, covered or uncovered, as an opaque partition or divider or the like. Also, the outer conductive panel 313 may be covered with an insulated layer, such as paint, fabric, cork, or the like.

Figure 21:
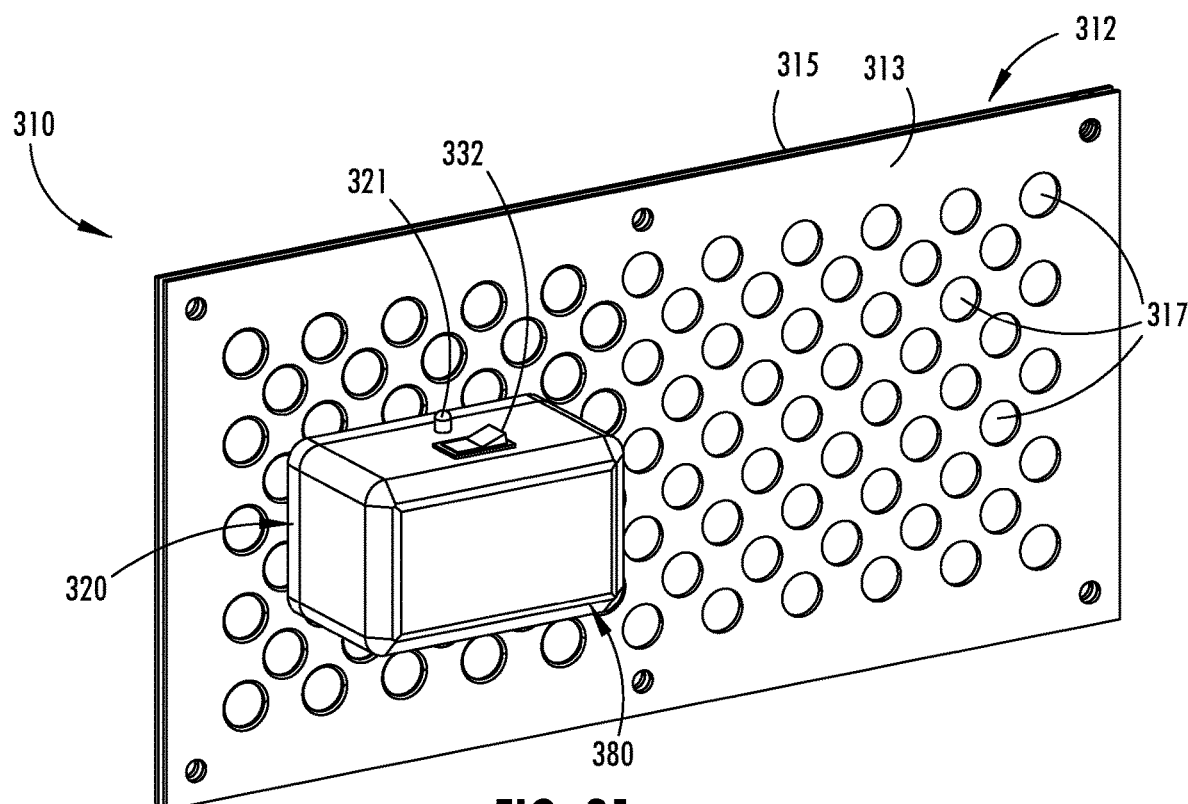
FIG. 21 is a front, upper perspective view of a further example of a panel of a low voltage power distribution system, showing an application module engaged to the panel.
Figure 22:
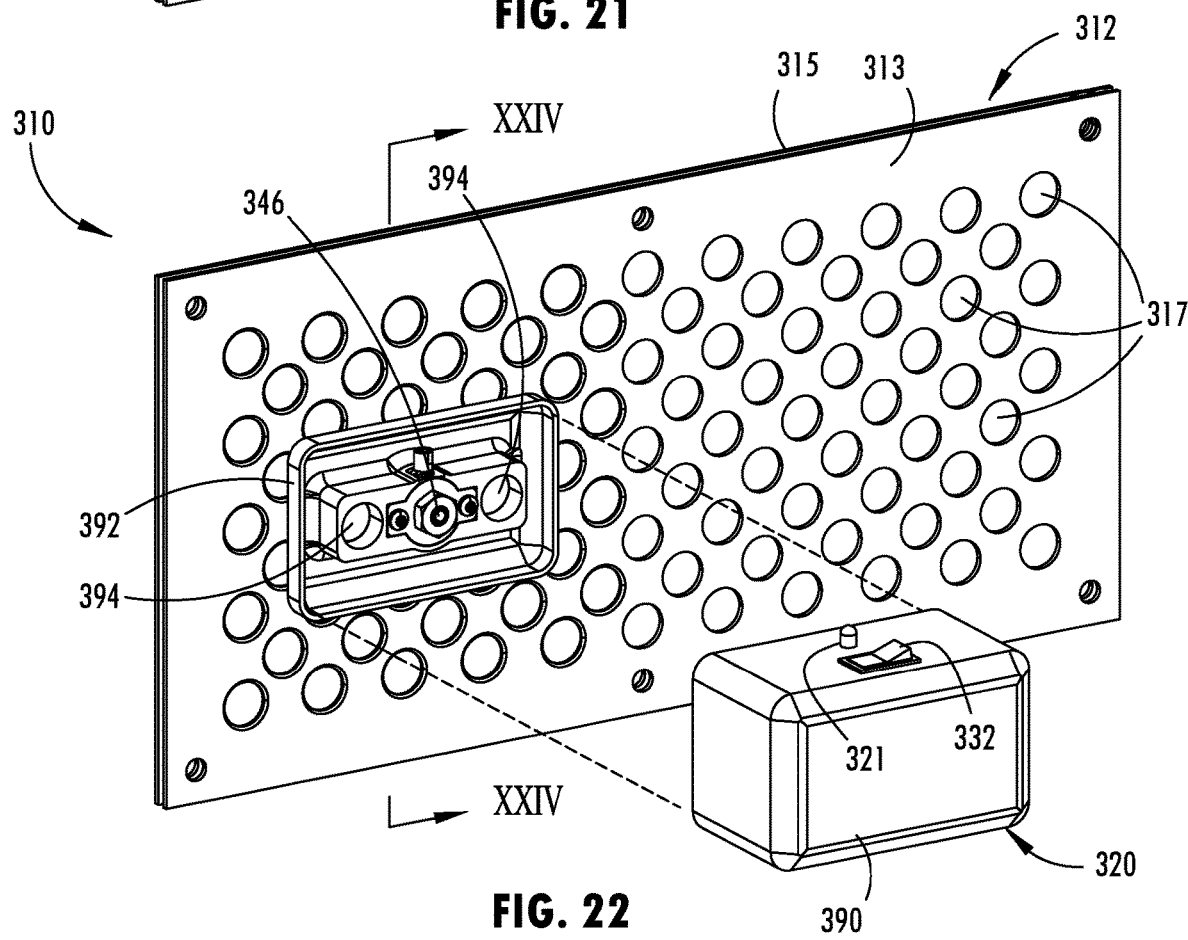
FIG. 22 is a front, upper perspective view of the panel shown in FIG. 21 with a portion of the application module exploded away from the panel.

The outer conductive panel 313, as shown in FIGS. 21 and 22, has openings 317 that allow a contact stud 322 of the application module 320 to engage at a plurality of locations, both vertically and horizontally, over the panel assembly 312. The openings 317 disposed over the outer conductive panel 313 may define the plurality of locations for engaging the application module 320. The openings 317 in the outer panel 313 may have a shape that corresponds with a contact stud 322, such as a circular hole. Alternatively, it is contemplated that holes with other conceivable shapes, such as orthogonal shapes or elongated slots, may be formed in addition to or in place of circular shaped holes at the outer panel. Further, it is understood that the holes may have various different sizing and spacing from each other from the illustrated example.

Figure 24:
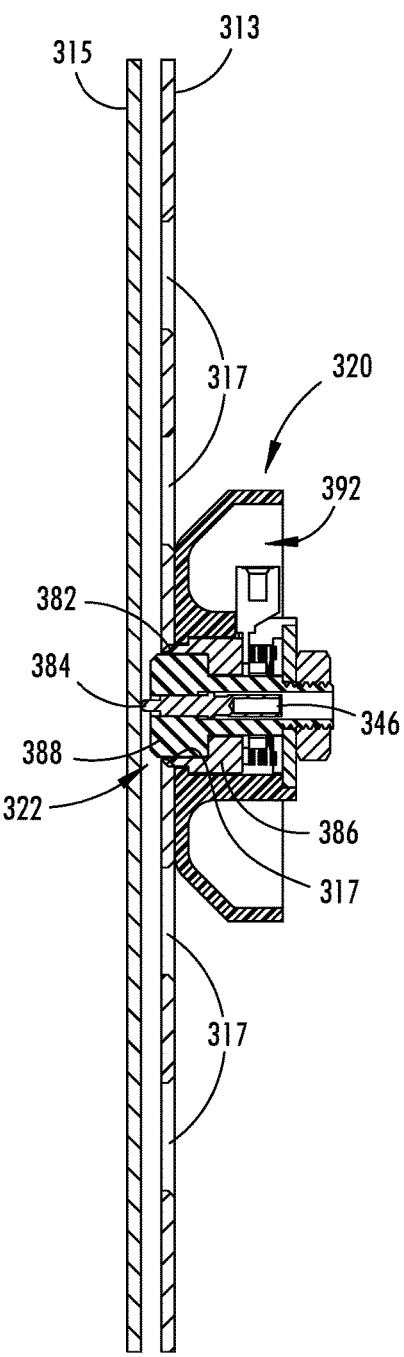
FIG. 24 is a cross-sectional view of a portion of the application module shown in FIG. 22 engaged to the panel.

The outer and inner panels 313, 315 are substantially planar and oriented in planar parallel alignment with each other, such as shown in FIGS. 21, 22, and 24. It is also contemplated that other examples of the panels may be curved or have angular transition and may still be provided in spaced parallel alignment. Also, the panel assembly 312 may include an insulating spacer disposed between the panels 313, 315 to maintain the spacing away from each other, such as with an electrically insulating stand-off piece, such as a plastic washer, or insulating substrate layer, such as a fiberglass sheet, disposed between the outer and inner conductive panels 313, 315. Alternatively, the panels 313, 315 may be insulated from each other by an air gap, which may be maintained by the rigidity of the panels 313, 315 and any supportive structure of the a frame or stand that support the panels.

As shown in FIGS. 21-24, the application module 320 has a first contact that is configured to engage the outer panel 313 and a second contact that is configured to extend through the outer panel 313 and engage the inner panel 315. The second contact on the application module 320 is electrically insulated from the first contact and the outer panel 313 for the panel assembly 312 to deliver power to the engaged application module 320. As further shown in FIGS. 21-24, the application module 320 has a housing 380 and a single stud 322 that protrudes from a rear portion of the housing 380. The first contact of the application module 320 that engages the outer panel 313, such as shown in FIG. 24, is disposed at a base portion 382 of the contact stud 322. The second contact of the application module 320 is then disposed at a tip portion 384 of the stud 322 for extending through an opening 317 to engage the inner panel 315.

Figure 23:
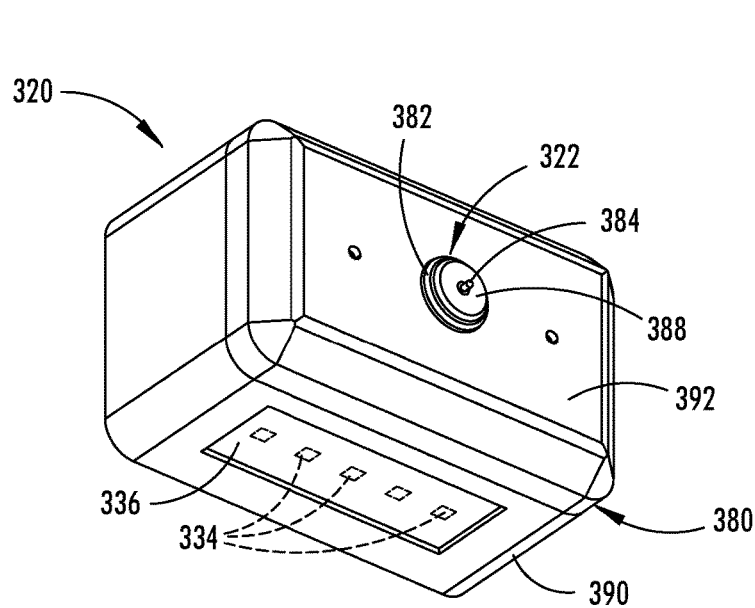
FIG. 23 is a rear, lower perspective view of the application module shown in FIG. 21 disengaged from the panel.

The singular contact stud 322 of the application module 320 shown in FIGS. 23 and 24, thus, contains two independent contacts, insulated from one another, each of which make contact with a different panel (inner and outer). This allows electricity to conduct through the single stud 322, since it contains both isolated legs of the circuit. Specifically, as illustrated in FIG. 24, the tip portion 384 of the stud 322 has a pin 346 that extends centrally through a chamber of the stud 322 to contact the inner panel 315, while the base portion 382 of the stud 322 has a collar 386 that engages the peripheral edge of the outer panel 313 surrounding the opening 317, such as at a chamfered edge. The pin 346 and collar 386 of the stud are electrically insulated from each other by a core insulator 388 that surrounds the pin 346. The stud 322 may include a spring 342 that absorbs potential movement of the module due to movement of the overall structure, such as a furniture piece, and may compensate for tolerance differences in the spacing and depth of the conductive members. In addition to mechanical biasing purposes, the spring may be used as a conductive element to transfer current between the stud and the module's electrical components.

As shown in FIG. 22, the application module 320 includes a housing 380 that has an outer portion 390 that houses the internal component or components of the module 320 and an inner portion 392 that houses the stud assembly 322. The inner portion 392 has cavities 394 that may receive magnets configured to bias the application module 320 against the outer panel 313 when the contacts are in engagement with the respective outer and inner panels 313, 315. The outer portion of the housing 390 has a switch 332 at the upper surface of the module 320 for actuating a component of the module, such as the illustrated light source 334. However, it is contemplated that additional examples of the application module 320 may also or alternatively include speakers, displays, control circuitry, wireless connectivity chips, or the like. Upon engaging the conductive members or panels 313, 315 to the stud 322, the application module 320 makes an electrical connection with the panel assembly 312, such that an indicator light 321 on the application module 320 (FIG. 22) may illuminate to notify a user of the electrical connection. The conductive panels 313, 315 may thereby deliver the low voltage power to the engaged contact stud 322 of the application module 320.

Thus, the application module may electrically connect with the engaged location of the panel assembly so as to power or supply electricity to the integrated component or components of the application module. The panel assembly may include an outer cover that conceals the electrical elements or members that are integrated into the panel assembly, such that the application module may pierce through the outer cover to engage the electrical elements or members and form an electrical connection therewith. The panel assembly may optionally include conductive plates that are spaced from each other, such that the application module may engage through at least one of the conductive plates to form an electrical connection with the panel assembly.

For purposes of this disclosure, the terms "upper," "lower," "right," "left," "rear," "front," "vertical," "horizontal," "inner," "outer," "inner-facing," "outer-facing," and derivatives thereof shall relate to the assembly as oriented in FIG. 1. However, it is to be understood that it may assume various alternative orientations, except where expressly specified to the contrary. It is also to be understood that the specific devices and processes illustrated in the attached drawings, and described in this specification are simply exemplary embodiments of the inventive concepts defined in the appended claims. Hence, specific dimensions and other physical characteristics relating to the embodiments disclosed herein are not to be considered as limiting, unless the claims expressly state otherwise.

Changes and modifications in the specifically described embodiments may be carried out without departing from the principles of the present invention, which is intended to be limited only by the scope of the appended claims as interpreted according to the principles of patent law. The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

What is claimed is:

1. A power distribution system comprising:
   a panel assembly comprising (i) a first conductive structure having a first metal panel with a plurality of openings extending through a planar extent of the first metal panel and (ii) a second conductive structure having a second metal panel spaced from the first metal panel and fixed in parallel planar alignment with the first metal panel, wherein the plurality of openings in the first metal panel overlap with the second metal panel;
   an application module comprising a housing and a stud that protrudes from the housing, the stud having (i) a first contact disposed at a base portion of the stud and (ii) a second contact disposed at a tip portion of the stud and electrically insulated from the first contact, the stud comprising a barrel and a pin that extends through a chamber of the barrel, wherein the pin is slidable and spring biased relative to the barrel;
   wherein the application module is configured to engage one of a plurality of attachment locations defined by the plurality of openings disposed over the first metal panel; and
   wherein, with the application module engaged at a select one of the plurality of attachment locations, the first contact conductively engages the first metal panel, the second contact extends through the select one of the plurality of openings in the first metal panel and conductively engages the second metal panel, and the second contact is electrically insulated from the first conductive structure for the panel assembly to deliver power to the application module via the engaged first and second contacts.

2. The power distribution system of claim 1, wherein the application module comprises an attachment feature that is configured to attach and support the application module at the panel assembly.

3. The power distribution system of claim 2, wherein the attachment feature comprises a magnet arranged to bias a housing of the application module against an outer surface of the panel assembly.

4. The power distribution system of claim 1, wherein the plurality of openings are arranged in a grid pattern that defines the plurality of attachment locations for engaging the application module.

5. The power distribution system of claim 1, wherein the application module comprises a two-point connection stud comprising a barrel and a pin that extends through a chamber of the barrel, and wherein the first contact comprises the barrel and the second contact comprises the pin.

6. The power distribution system of claim 1, wherein the panel assembly includes an insulating spacer disposed between the first and second metal panels to maintain the spacing away from each other.

7. The power distribution system of claim 1, wherein an insulating cover is disposed at least partially over the first conductive structure and defines an outer surface of the panel assembly.

8. The power distribution system of claim 7, wherein the insulating cover includes a fabric that provides a series of holes that align with the plurality of openings in the first metal panel to receive the first and second contacts of the application module.

9. The power distribution system of claim 1, wherein the application module includes at least one of a light source, a speaker, or a receptacle that is configured to receive an accessory cord for transmitting power and/or data.

10. The power distribution system of claim 1, wherein the application module comprises a light source having an array of light-emitting diodes disposed in the housing.

11. The power distribution system of claim 10, wherein the housing includes a transparent substrate disposed over the light source for the array of light-emitting diodes to illuminate through the transparent substrate.

12. The power distribution system of claim 1, wherein the application module comprises a housing and first and second studs that protrude from a rear portion of the housing, and wherein the first contact is disposed at the first stud and the second contact is disposed at the second stud.

13. A power distribution system comprising:
   a panel assembly having an outer metal panel and an inner metal panel spaced from the outer metal panel, wherein the outer metal panel comprises a plurality of openings that overlap the inner metal panel and are arranged in a grid pattern to define a plurality of attachment locations;
   an application module comprising a housing and a stud that protrudes from the housing, the stud having a first contact disposed at a base portion of the stud and a second contact disposed at a tip portion of the stud and electrically insulated from the first contact, the stud comprising a barrel and a pin that extends through a chamber of the barrel, wherein the pin is slidable and biased relative to the barrel;
   wherein the application module is configured to attach to a select one of the plurality of attachment locations disposed over the outer metal panel of the panel assembly for the panel assembly to deliver power to the application module; and
   wherein, with the application module attached at the select one of the plurality of attachment locations, the first contact engages the outer metal panel and the second contact engages the inner metal panel by extending through one of the plurality of openings in the outer metal panel that corresponds with the select one of the plurality of attachment locations.

14. The power distribution system of claim 13, wherein the application module includes a magnet configured, with the first and second contacts in engagement with the respective outer and inner metal panels, to bias an inner surface of the application module against the outer metal panel.

15. The power distribution system of claim 13, wherein the first contact engages the outer metal panel at a periphery of the opening that corresponds with the select one of the plurality of attachment locations.

16. The power distribution system of claim 13, wherein the outer metal panel is substantially planar and disposed in generally planar parallel alignment with the inner metal panel, and wherein the panel assembly includes an insulating spacer disposed between the outer and inner metal panels to maintain the spacing away from each other.

17. The power distribution system of claim 13, wherein the application module comprises a light source having an array of light-emitting diodes disposed in the housing and configured to illuminate through a transparent substrate disposed over the light source.

18. The power distribution system of claim 17, wherein the application module includes at least one of a light source, a speaker, or a receptacle disposed at the housing.

19. A method of delivering electricity to an application module supported at a desired location on a panel assembly, said method comprising:
  providing a panel assembly having (i) an outer metal panel with a plurality of openings extending through a planar extent of the outer metal panel and (ii) an inner metal panel fixed in parallel planar alignment with the outer metal panel;
  positioning an application module on an outer surface of the panel assembly at one of a plurality of attachment locations defined by the plurality of openings in the outer metal panel, the application module comprising a housing and a stud that protrudes from the housing, the stud having a first contact disposed at a base portion of the stud and a second contact disposed at a tip portion of the stud and electrically insulated from the first contact, the stud comprising a barrel and a pin that extends through a chamber of the barrel, the pin slidable and biased relative to the barrel;
  engaging the first contact on the application module with the first metal panel to form a first electrical connection;
  engaging the second contact of the application module through a select opening in the outer metal panel and into engagement with the inner metal panel to form a second electrical connection insulated from the first electrical connection; and
  wherein the application module includes an attachment feature configured, with the first and second contacts in engagement with the outer and inner metal panels, to attach and support the application module at the outer surface of the panel assembly.

20. The method of claim 19, wherein the plurality of openings are arranged in a grid pattern that defines the plurality of attachment locations for engaging the application module.

21. The method of claim 19, a light source having an array of light-emitting diodes disposed in the housing and configured to illuminate through a transparent substrate disposed over the light source.

\* \* \* \* \*